US010440812B2

(12) United States Patent
He et al.

(10) Patent No.: US 10,440,812 B2
(45) Date of Patent: Oct. 8, 2019

(54) HEATSINK MOUNTING SYSTEM TO MAINTAIN A RELATIVELY UNIFORM AMOUNT OF PRESSURE ON COMPONENTS OF A CIRCUIT BOARD

(71) Applicant: Dell Products L. P., Round Rock, TX (US)

(72) Inventors: Qinghong He, Austin, TX (US); Hou-Chun Huang, Austin, TX (US)

(73) Assignee: Dell Products L. P., Round Rock, TX (US)

( * ) Notice: Subject to any disclaimer, the term of this patent is extended or adjusted under 35 U.S.C. 154(b) by 83 days.

(21) Appl. No.: 15/905,201

(22) Filed: Feb. 26, 2018

(65) Prior Publication Data

US 2019/0269005 A1 Aug. 29, 2019

(51) Int. Cl.
*H05K 1/02* (2006.01)
*G06F 1/20* (2006.01)
*F28F 3/02* (2006.01)
*H01L 23/40* (2006.01)
*H01L 25/07* (2006.01)

(52) U.S. Cl.
CPC .............. *H05K 1/0203* (2013.01); *F28F 3/02* (2013.01); *G06F 1/20* (2013.01); *H01L 23/4006* (2013.01); *H01L 25/072* (2013.01); *F28F 2275/20* (2013.01); *H01L 2023/4087* (2013.01); *H05K 2201/066* (2013.01)

(58) Field of Classification Search
CPC .............. G06F 1/181–182; G06F 1/20; H05K 7/20218–20381; H05K 7/20409–20418; H05K 7/20009–202; H05K 1/0203; H05K 2201/0066; H01L 23/367–3677; H01L 23/473; H01L 23/46–467; H01L 2023/4087; H01L 23/40–4006; F28F 3/02; F28F 2275/20
See application file for complete search history.

(56) References Cited

U.S. PATENT DOCUMENTS

| 2006/0215383 | A1* | 9/2006 | Unrein | H01L 23/4006 361/810 |
| 2015/0327353 | A1* | 11/2015 | Dickover | H05K 7/2039 361/679.54 |
| 2017/0290209 | A1* | 10/2017 | Craig | H05K 1/021 |

* cited by examiner

*Primary Examiner* — Robert J Hoffberg
*Assistant Examiner* — Razmeen Gafur
(74) *Attorney, Agent, or Firm* — Campbell Stephenson LLP; Shiv S. Naimpally

(57) ABSTRACT

In some examples, a computing device may include a heatsink, a thermal spreader, a first thermal pad located between the heatsink and the thermal spreader, a circuit board comprising a plurality of components, and a second thermal pad located between the thermal spreader and the circuit board. A plurality of standoffs may be located between the heatsink and the circuit board. Each standoff of the plurality of standoffs may pass through a corresponding spring of a plurality of springs and pass through a corresponding mounting hole of a plurality of mounting holes in the thermal spreader. Each screw of a plurality of screws may engage with a corresponding standoff of the plurality of standoffs. The plurality of springs may cause the thermal spreader and the second thermal pad to a relatively uniform amount of pressure to each component of the plurality of components.

20 Claims, 10 Drawing Sheets

HEATSINK MOUNTING SYSTEM TO MAINTAIN A RELATIVELY UNIFORM AMOUNT OF PRESSURE ON COMPONENTS OF A CIRCUIT BOARD

BACKGROUND OF THE INVENTION

Field of the Invention

This invention relates generally to computing devices and, more particularly to mounting a heatsink to one or more heat-generating components of a circuit board in a manner in which the heatsink is rigidly mount mounted to the circuit board while allowing the heatsink to float and maintain approximately a same amount of contact and pressure with the heat-generating components.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Computing devices may come in industrial-grade form factors to enable them to be mounted outside (e.g., exposed to external weather conditions), on a factory floor, in a heating ventilation and air conditioning (HVAC) system, or other such environments. The computing devices may be designed to operate within a wide temperature range, such as, for example, from −30° C. to 70° C. In some cases, a fanless design may be used in which a printed circuit board (PCB) is rigidly mounted to a single large metal heatsink (e.g., that is part of the enclosure) to provide thermal dissipation to heat generating components (e.g., central processing unit (CPU), memory, and the like) while enabling the computing device to withstand shocks and vibrations. The contact between the heatsink and the heat generating components that are mounted on the PCB may be determined by multiple standoffs. A standoff is a cylindrical protrusion placed in an enclosure into which a screw may be attached to secure the PCB to the enclosure. To rigidly mount the PCB to the heatsink/enclosure, multiple screws may pass through holes in the PCB and be secured in the standoffs. For example, the inner surface of each cylindrical standoff may be threaded to enable each screw of the multiple screws that pass through the holes in the PCB to be secured to a corresponding standoff.

However, rigidly mounting a heatsink to one or more heat generating components of a PCB may result in various problems. For example, manufacturing tolerances in the height of each standoff, a warp in the PCB, or both may result in uneven contact between the heatsink and the heat generating components of the PCB. The uneven contact may result in (1) a gap between the heatsink and one or more of the heat generating components, (2) pressure on one or more of the heat generating components that exceeds an amount of pressure that the heat generating component is designed to withstand, or both (1) and (2). A gap between the heatsink and a heat generating component, such as the CPU, may cause excess heat and result in the component overheating. If the heat sink exerts too much pressure on a heat generating component, such as the CPU, the pressure may exceed the tolerances of a component, causing the component's housing to crack, and damaging the component (e.g., rendering the component inoperable). Thus, using a fanless design that includes a large heatsink may result in a computing device that is prone to failure due to the uneven pressure applied by the heatsink on the heat-generating components.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing device may include a heatsink, a thermal spreader, a first thermal pad located between the heatsink and the thermal spreader, a circuit board comprising a plurality of components, and a second thermal pad located between the thermal spreader and the circuit board. A plurality of standoffs may be located between the heatsink and the circuit board. Each standoff of the plurality of standoffs may pass through a corresponding spring of a plurality of springs and pass through a corresponding mounting hole of a plurality of mounting holes in the thermal spreader. Each screw of a plurality of screws may engage with a corresponding standoff of the plurality of standoffs. The plurality of springs may cause the thermal spreader and the second thermal pad to a relatively uniform amount of pressure to each component of the plurality of components.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
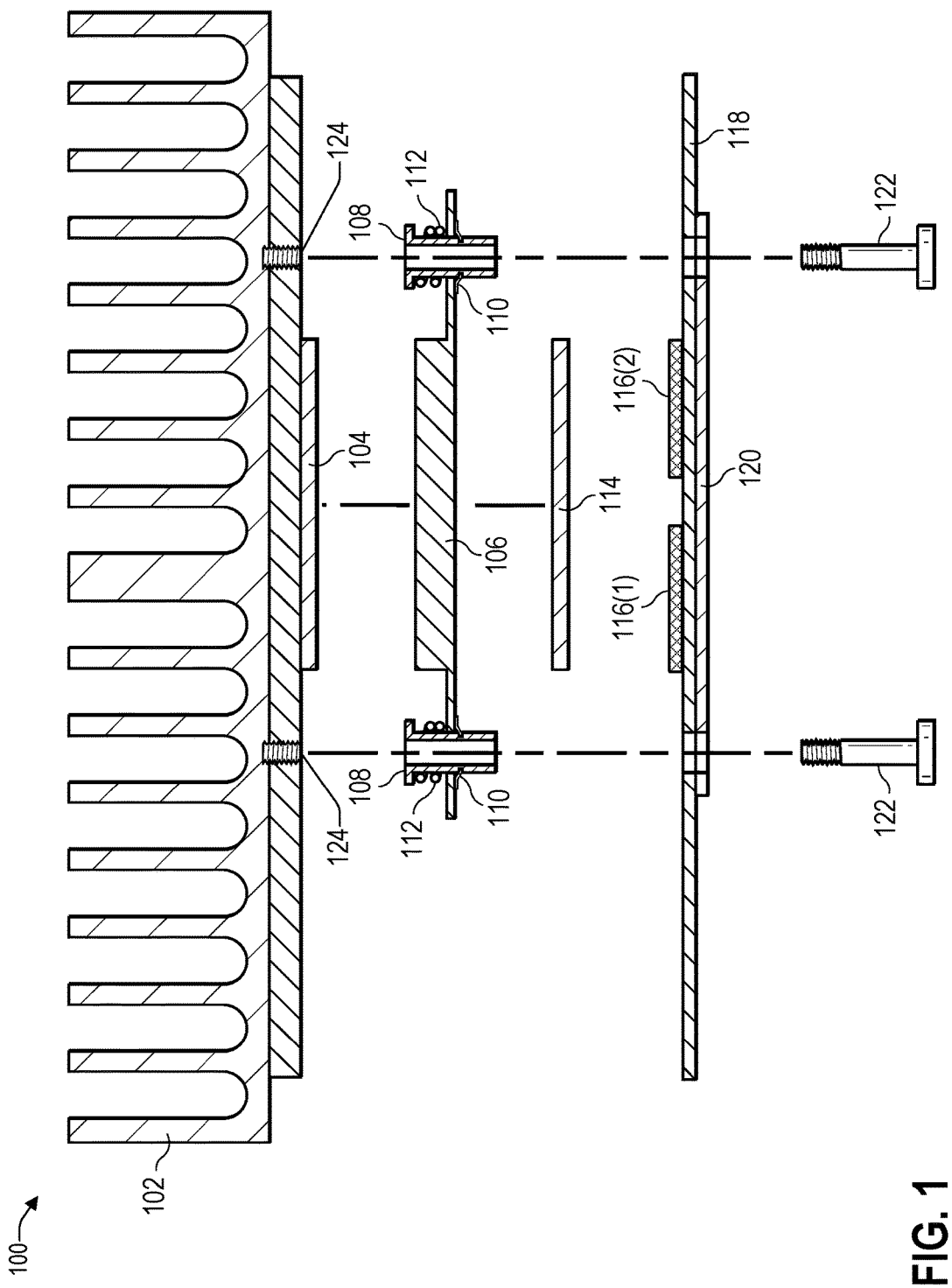
FIG. 1 is a block diagram illustrating components of a mechanism to mount a heatsink to a circuit board according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

A computing device (e.g., an IHS) may be manufactured in a relatively small form-factor (e.g., 10"×10"×3" or smaller, such as, for example, 5"×5"×2") for use in a variety of applications, such as, for example, being placed outdoors (e.g., exposed to the elements), in a factory (e.g., to control robots and machinery), and other harsh environments. An example of a small form-factor (SFF) computing device is an Edge Gateway to enable wired devices and wireless devices to communicate with each other (e.g., by transferring data) over a network, such as the Internet, to enable the Internet of Things (IoT). The Edge Gateway may be located close to devices (e.g., robots, computer-controlled machines, and the like) and/or sensors (e.g., cameras, thermostats, and the like) and may be designed to withstand harsh conditions (e.g., temperatures ranging from −30° C. to 70° C.). An SFF computing device may come in different industrial-grade form factors to enable the Edge Gateway to be mounted outside (e.g., exposed to external weather conditions), on a factory floor, in a heating ventilation and air conditioning (HVAC) system, or other indoor or outdoor environments.

A computing device, such as an Edge Gateway, may use a fanless design in which a printed circuit board (PCB) is mounted to a large metal heatsink that comprises a portion of the enclosure. The metal heatsink may provide thermal dissipation to heat generating components (e.g., central processing unit (CPU), graphics processing unit (GPU), memory, solid state drive (SSD), voltage regulator, chip set associated with the CPU, and the like) of the computing device while enabling the computing device to withstand shocks and vibrations. To mount the PCB to the heatsink/enclosure, multiple fasteners (e.g., screws) may pass through holes in the PCB and be secured in multiple standoffs. For example, the inner surface of each cylindrical standoff may be threaded to enable each screw of the multiple screws that pass through the holes in the PCB to be secured to a corresponding standoff.

Manufacturing tolerances may result in variations in the length of each of the multiple standoffs may vary by plus/minus 0.1 millimeter (mm) Thus, if a first standoff is shorter (e.g., minus) by about 0.1 mm and a second standoff is longer (e.g., plus) by about 0.1 mm, then the total variation between the two standoffs may be about 0.2 mm In addition, the PCB may have a warp, resulting in 0.5 mm up to about 1.0 mm variation. Thus, the combination of variation in the standoff length and PCB warp may result in height variations between the top surfaces of heat generating components mounted on the PCB of up to about 1.2 mm Rigidly attaching a heatsink to the PCB may result in a lack of uniform contact and lack of uniform pressure between the heatsink and the components. Insufficient contact may lead to components overheating. Excess pressure that exceeds the tolerances of component packaging may result in damage to the packaging. While thicker thermal pads can be used between the heatsink and the components to try and address the variations in tolerances, the thicker thermal pads may not conduct heat very well, causing overheating issues.

To apply a relatively uniform amount of pressure to the heat generating components of the PCB, the systems and techniques described herein use multiple springs in the mechanism used to attach the metal heatsink to the PCB. For example, individual fasteners may pass through individual springs when the individual fasteners are being secured to the metal heatsink. The springs may enable the heatsink to "float" relative to the heat generating components mounted on the PCB, thus causing the heatsink to provide a relatively uniform amount of pressure (e.g., less than or equal to a predetermined amount of pressure) between the heatsink and the heat generating components. By using multiple springs to provide a relatively uniform amount of pressure between the heatsink and the heat generating components, uneven contact between the heatsink and the heat generating components may be avoided.

The multiple springs may compensate for manufacturing tolerances in the height of each standoff, warpage of the PCB, or both. By providing a relatively uniform amount of pressure between the heatsink and the heat generating components, (1) gaps between the heatsink and the one or more of the heat generating components may be reduced or eliminated and (2) the pressure on the heat generating components may not exceed the amount of pressure that the heat generating component is designed to withstand. In this way, the relatively uniform pressure may enable the heatsink to dissipate heat, thereby preventing components from overheating. In addition, the relatively uniform pressure may apply an amount of pressure that does not exceed the tolerances of the component, preventing the component from becoming damaged. The mechanism described herein enables the heatsink to be rigidly mounted to the PCB while simultaneously enabling the heatsink to float (e.g., non-rigid mounting) and apply a relatively uniform amount of pressure to one or more components (e.g., CPU, CPU chip set, GPU, memory, SSD, voltage regulator, and the like).

As a first example, a computing device may include a heatsink, a thermal spreader, a first thermal pad located between the heatsink and the thermal spreader, a circuit board comprising a plurality of components, a second thermal pad located between the thermal spreader and the circuit board, a plurality of standoffs located between the heatsink and the circuit board and a plurality of springs. Each standoff of the plurality of standoffs may pass through a corresponding spring of the plurality of springs and pass through a corresponding mounting hole of a plurality of mounting holes in the thermal spreader. A plurality of screws may be used to attach the heatsink to the circuit board. For example, each screw of the plurality of screws may engage with a corresponding standoff of the plurality of standoffs. After each screw is fully engaged with a corresponding standoff, the plurality of springs may cause the thermal spreader and the second thermal pad to apply a predetermined amount of pressure to the plurality of components. For example, the predetermined amount of pressure (1) may be less than a maximum amount of pressure that individual components of the plurality of components are designed to withstand and (2) may be sufficient to enable the second thermal pad to come in contact with a predetermined percentage (e.g., 70%, 80%, 90%, 95%, or the like) of the upper surface of individual components of the plurality of components. The plurality of components may include a CPU and at least one of: a GPU, a CPU chip set, a voltage regulator, a wireless communication card, a hard disk drive, an SSD, or main memory (e.g., RAM). The first thermal pad and the second thermal pad may include a silicone or polysynthetic oil base that is infused with ceramic particles, silver particles, zinc oxide particles, aluminum oxide particles, boron nitride particles, aluminum particles, or any combination thereof. A corresponding locking ring may be used to secure individual standoffs of the plurality of standoffs to the thermal spreader. In some cases, the standoffs may be integrated into the heatsink while in other cases the standoffs may be fastened to the heatsink. The heatsink may be machine or diecast and may be part of an enclosure or chassis used to enclose the computing device.

As a second example, a computing device may include a circuit board having a plurality of heat-generating components mounted on the circuit board. The computing device may include a thermal spreader (e.g., made of copper or a copper alloy) with a first thermal pad above the thermal spreader and a second thermal pad below the thermal spreader. The computing device may include a plurality of standoffs and a heatsink (e.g., machined or diecast) placed on top of the plurality of standoffs. For example, the heatsink may be attached to the circuit board using a plurality of screws that engage with the standoffs, e.g., an external thread of an individual screw may engage with an internal thread of a corresponding standoff. The first thermal pad may be located below the heatsink. A top surface of the first thermal pad may be in contact with a bottom surface of the heatsink and a bottom surface of the first thermal pad may be in contact with a top surface of the thermal spreader. A top surface of the second thermal pad may be in contact with a bottom surface of the thermal spreader and a bottom surface of the second thermal pad may be in contact with a top surface of the heat-generating components. The computing device may include a plurality of springs. For example, individual standoffs of the plurality of standoffs may pass through individual springs of the plurality of springs. After the individual screw are fully engaged with the corresponding standoffs, the springs may cause the second thermal pad to apply an amount of pressure that is within a predetermined range to the heat-generating components. The predetermined range of pressure may be less than a maximum amount of pressure that individual components of the plurality of components are designed to withstand while being sufficient to cause the second thermal pad to come in contact with a predetermined percentage (e.g., 70%, 80%, 90%, 95%, or the like) of the upper surface of individual components of the plurality of heat-generating components. The plurality of heat-generating components may include two or more of: a CPU, a GPU, a CPU chip set, a voltage regulator, a wireless (e.g., Wi-Fi, 802.11, Bluetooth, cellular, or the like) communication card, a hard disk drive; an SSD, or memory (e.g., RAM). The first thermal pad and the second thermal pad may include at least one a thermal grease, a thermal gel, a thermal pad, or a thermal epoxy (e.g., applied as a liquid but hardening after a predetermined amount of time).

As a third example, a computing device may include a heatsink, a thermal spreader (e.g., made of copper or a copper alloy), a first thermal pad located between the heatsink and the thermal spreader, a circuit board that includes a plurality of heat-generating components, a second thermal pad located between the thermal spreader and the circuit board, and a plurality of standoffs located between the heatsink and the circuit board. Each standoff of the plurality of standoffs may pass through a corresponding spring of a plurality of springs and pass through a corresponding mounting hole of a plurality of mounting holes in the thermal spreader. Each screw of the plurality of screws may engage with a corresponding standoff of the plurality of standoffs. For example, an external thread of a particular screw may engage with an internal thread of a corresponding standoff. After the screws have been fully engaged (e.g., screwed) into the corresponding standoffs, the plurality of springs may cause the thermal spreader, and in turn the second thermal pad, to apply an amount of pressure to the plurality of heat-generating components that is within a predetermined range. For example, the highest pressure of the predetermined range may be less than a maximum pressure that each of the heat-generating components are designed to withstand. The amount of pressure applied to the plurality of heat-generating components may be sufficient to enable the second thermal pad to make contact with a predetermined percentage (e.g., 70%, 80%, 90%, 95%, or the like) of an external surface of individual heat-generating components of the plurality of heat-generating components. In some cases, the heatsink may be part of an enclosure for the computing device. A backplate may be placed below the circuit board. Each screw of the plurality of screws may pass through a corresponding hole of a plurality of holes in the backplate. The plurality of heat-generating components may include a CPU and at least one of a GPU, a CPU chip set, a voltage regulator, a wireless communication card, a hard disk drive, an SSD, or memory (e.g., RAM). The first and second thermal pad may include a base (e.g., either silicone or polysynthetic oil) and at least one of ceramic particles, silver particles, zinc oxide particles, aluminum oxide particles, boron nitride particles, or aluminum particles.

FIG. 1 is a block diagram illustrating components of a mechanism 100 to mount a heatsink to a circuit board according to some embodiments. A heatsink 102 may be used to dissipate heat generated by one or more components of a circuit board 118. For example, the circuit board 118 may be used to implement a specialized type of computing device, such as a ruggedized computer, an edge gateway, or other type of computing device. The heatsink 102 may include one or more types of thermally conductive metals, such as, for example, aluminum, graphene, iron, copper, nickel, another metal or any combination thereof. In some cases, the heatsink 102 may be a single unit that is manufactured using diecast, machining, or another type of manufacturing technique. In other cases, the heatsink 102 may be assembled using multiple parts that have each be manufactured using diecast, machining, or another type of manufacturing technique. The heatsink 102 may be a part of a chassis of a product. For example, the top portion of the heatsink 102 in FIG. 1 may be part of a portion of a chassis or an enclosure of a product.

A first thermal pad 104 may be mounted below the heatsink 102. The first thermal pad 104 may be between about 0.2 millimeters (mm) to about 2.0 mm in thickness, for example either about 0.5 mm, about 1.0 mm, or about 1.5 mm in thickness. The first thermal pad 104 may be comprised of a thermally conductive material and may include thermal grease, a gel, a pad, a liquid that hardens after being applied (e.g., an epoxy), or any combination thereof. The first thermal pad 104 may include a base (e.g., silicone or polysynthetic oils) infused with particles, such as, for example, ceramic particles, silver particles, zinc oxide particles, aluminum oxide particles, boron nitride particles, aluminum particles, or any combination thereof. The first thermal pad 104 may be relatively firm at room temperature (e.g., 20-25 degrees Celsius), but may become soft and able to fill gaps at warmer temperatures (e.g., greater than 25 degrees Celsius).

The first thermal pad 104 may provide contact between the heatsink 102 and a thermal spreader 106. The thermal spreader 106 may be machined or cast metal and may include one or more types of thermally conductive metals, such as, for example, aluminum, graphene, iron, copper, nickel, another metal or any combination thereof. For example, the thermal spreader 106 may be a block of metal that includes copper (or a copper alloy). The first thermal pad 104 may be a thermally conductive pad in a geometric shape (e.g., square, circular, rectangular, or the like) of a material (e.g., paraffin wax or silicone based infused with metal particles) that conducts heat away from the thermal spreader 106 and to the heatsink 102.

Each of multiple standoffs 108 may pass through a corresponding hole (of multiple holes) in the thermal spreader 106 and be secured to the thermal spreader 106 by a corresponding locking ring 110. Each of the standoffs 108 may have an approximately cylindrical or similar geometric shape. In some cases, the multiple standoffs 108 may be machined or diecast and be part of the heatsink 102. In other cases, the multiple standoffs 108 may be secured to the heatsink 102. For example, each of the standoffs 108 may be glued to the heatsink 102. As another example, each of the standoffs 108 may have an external thread and the heatsink 102 may have holes 124 with inner threads into which each of the standoffs 108 may be secured (e.g., by screwing each of the standoffs 108 into the corresponding holes 124 in the heatsink 102). In still other cases, the multiple standoffs 108 may be secured to the heatsink 102 by pressure applied by multiple fasteners (e.g., screws or the like) 122 when the multiple fasteners 122 are screwed into the internal threads of the holes 124 in the heatsink 102.

Multiple springs 112 may be deployed between the heatsink 102 and the thermal spreader 106. For example, each spring of the multiple springs 112 may be placed over an external surface of a corresponding one of the standoffs 108. The multiple springs 112 may enable the thermal spreader 106 to apply a relatively uniform amount of pressure on various heat generating components 116 of a circuit board 118, thereby compensating for (1) variations in the length of the standoffs 108, (2) warping of the circuit board 118, and the like. While two heat generating components 116 are illustrated in FIG. 1, the heat generating components 116 may include more than two components. The heat generating components 116 may include one or more of a CPU, a chip set associated with the CPU, a GPU, memory (e.g., random access memory (RAM)), hard drive, SSD, voltage regulator, wireless card (e.g., to enable communications via a technology such as Bluetooth®, Wi-Fi®, code division multiple access (CDMA), global system for mobile (GSM), and the like), another heat-generating component, or any combination thereof. The heat generating components 116 may be mounted on the circuit board 118 in such a way that a top surface of each of the heat generating components 116 may come in contact with a bottom surface of a second thermal pad 114.

The second thermal pad 114 may be located between a bottom of the thermal spreader 106. The second thermal pad 114 may include materials similar to the first thermal pad 104. For example, the second thermal pad 114 may be between about 0.2 mm to about 2.0 mm in thickness, and typically about 0.5 mm, about 1.0 mm, or about 1.5 mm in thickness. The second thermal pad 114 may be comprised of a thermally conductive material and may include thermal grease, a gel, a pad, a liquid that hardens after being applied (e.g., an epoxy), or any combination thereof. The second thermal pad 114 may include a base (e.g., silicone or polysynthetic oils) infused with particles, such as, for example, ceramic particles, silver particles, zinc oxide particles, aluminum oxide particles, boron nitride particles, aluminum particles, or any combination thereof. The second thermal pad 114 may be relatively firm at room temperature (e.g., 20-25 degrees Celsius), but may become soft and able to fill gaps at warmer temperatures (e.g., greater than 25 degrees Celsius). The second thermal pad 114 may provide contact with and help transfer heat from the heat generating components 116 for dissipation via the thermal spreader 106 and the heatsink 102. The second thermal pad 114 may be a thermally conductive pad in a geometric shape (e.g., square, circular, rectangular, or the like) and may include a material (e.g., paraffin wax or silicone base that is infused with metal particles) that conducts heat away from the heat generating components 116 to the thermal spreader 106.

A backplate 120 may be placed underneath the circuit board 118. The backplate 120 may include (or be coated with) a non-conductive material to prevent the backplate 120 from creating short circuits on the bottom of the circuit board 118. The backplate 120 may provide reinforcement to the circuit board 118 when the fasteners (e.g., screws) 122 are used to secure the circuit board 118 to the thermal spreader 106 and the heatsink 102. Thus, the fasteners 122 may be inserted through holes in the backplate 120, through holes in the circuit board 118, and through the standoffs 108. The fasteners 122 may be secured into corresponding holes 124 in the heatsink 102. For example, the fasteners 122 may have external threads that may engage with internal threads in the holes 124, such that by turning the fasteners 122 in a particular direction (e.g., clockwise), the fasteners 122 may be secured to the heatsink 102.

Thus, the heat generating components 116 of the circuit board 118 may dissipate heat by contact with the second thermal pad 114 to the thermal spreader 106. The thermal spreader 106 may in turn dissipate the heat from the heat generating components 116 by contact with the first thermal pad 104 to the heatsink 102. In this way, the heat produced by the heat generating components 116 may be dissipated without the use of any fans, resulting in a fanless design. The fanless design may reduce the amount of noise that is produced and reduce the amount of energy (e.g., electricity) being consumed by the computing device. While the fasteners 122 are illustrated as being machine screws that engage in the inner threads of the holes 124, other types of fasteners, such as, for example, anchors, bolts, hardware, nails, nuts, pins, clips, rivets, rods, and the like may be used to mount the heatsink 102 to the circuit board 118.

In some cases, the heatsink 102 along with the first thermal pad 104 may be mounted to the circuit board 118 in such a way that the first thermal pad 104 is in contact with the heat generating components 116. In such cases, the thermal spreader 106 and the second thermal pad 114 may be omitted.

Figure 2:
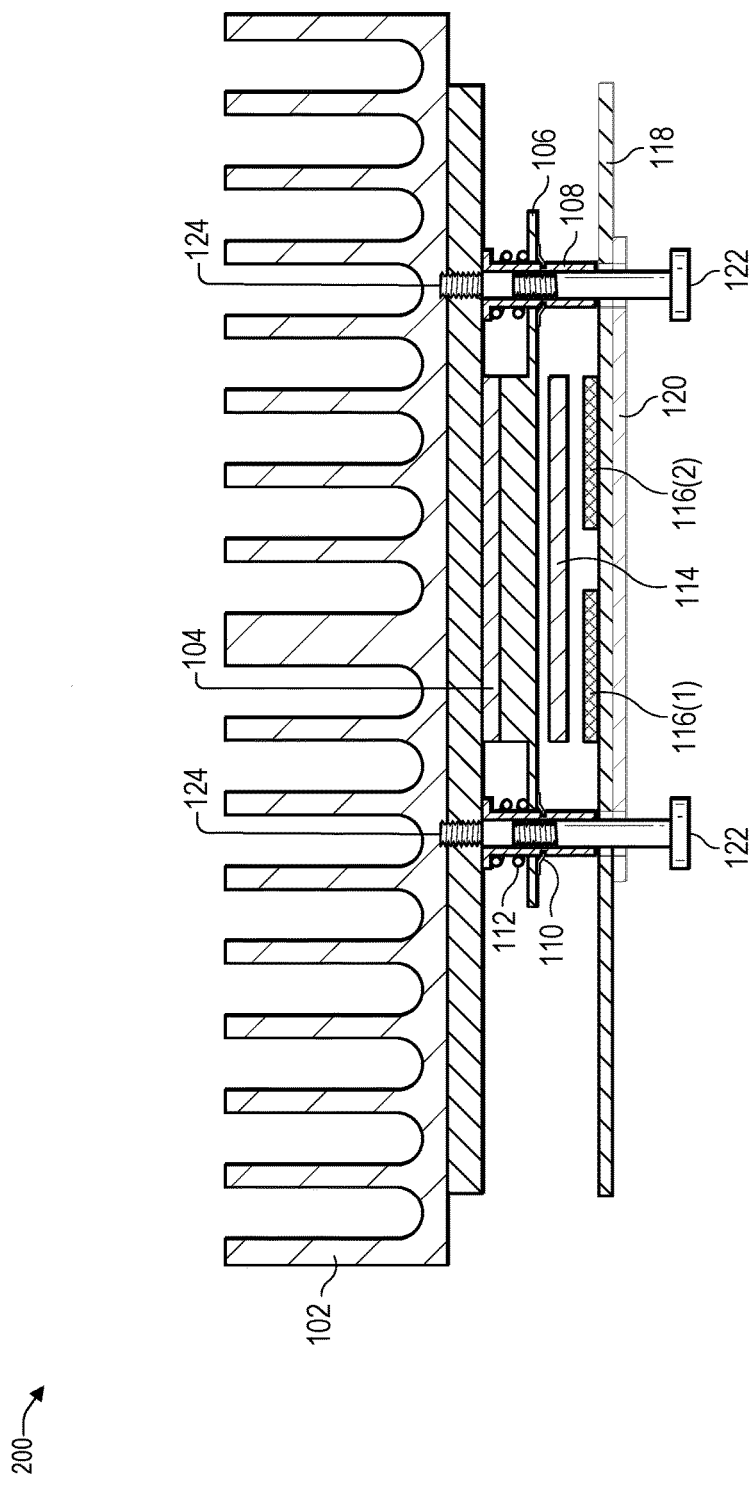
FIG. 2 is a block diagram illustrating a first position of a mechanism to mount a heatsink to a circuit board according to some embodiments.

FIG. 2 is a block diagram illustrating a first position 200 of a mechanism (e.g., the mechanism 100 of FIG. 1) to mount a heatsink to a circuit board according to some embodiments. In the first position 200, each of the fasteners 122 may be partially inserted into corresponding ones of the standoffs 108. The standoffs 108 may be attached to the heatsink 102 and to the thermal spreader 106. The locking rings 110 may secure the standoffs 108 to the thermal spreader 106. A top surface of the first thermal pad 104 may be in contact with a bottom surface of the heatsink 102. A bottom surface of the first thermal pad 104 may be in contact with a top surface of the thermal spreader 106. The springs 112 may be partially compressed after the standoffs 108 have been attached to the heatsink 102 and to the thermal spreader 106 using the locking rings 110.

Figure 3:
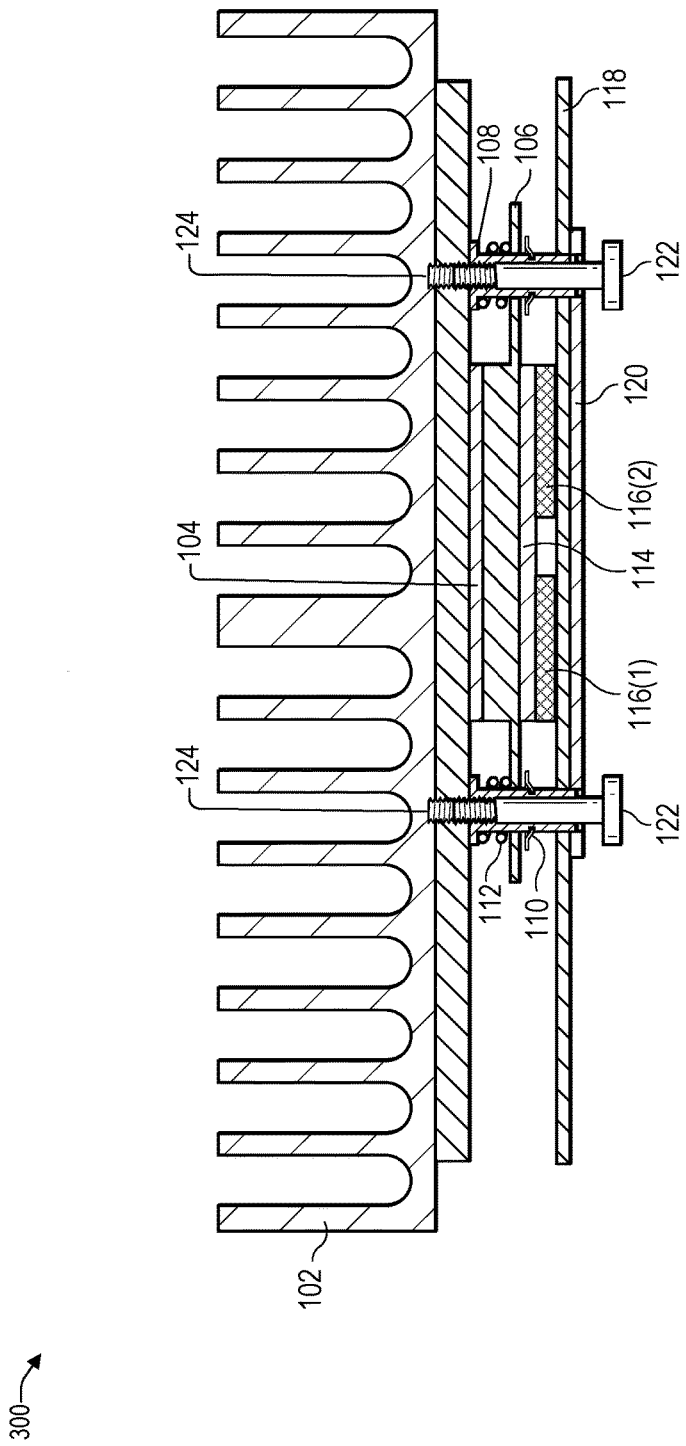
FIG. 3 is a block diagram illustrating a second position of a mechanism to mount a heatsink to a circuit board according to some embodiments.

FIG. 3 is a block diagram illustrating a second position 300 of a mechanism (e.g., the mechanism 100 of FIG. 1) to mount a heatsink to a circuit board according to some embodiments. In the second position 300, each of the fasteners 122 may be partially engaged into corresponding ones of the holes 124 in the heatsink 102 as part of the process of securing the external threads of the fasteners 122 into the internal threads of the holes 124. The standoffs 108 may be attached to the heatsink 102 and to the thermal spreader 106. The locking rings 110 may secure the standoffs 108 to the thermal spreader 106. A top surface of the first thermal pad 104 may be in contact with a bottom surface of the heatsink 102. A bottom surface of the first thermal pad 104 may be in contact with a top surface of the thermal spreader 106. A bottom surface of the second thermal pad 114 may be in contact with a top surface of heat generating components 116(1), 116(2) that are mounted on the circuit board 118. The springs 112 may be further compressed (e.g., as compared to FIG. 2) due to the external threads of the fasteners (e.g., screws) 122 being partially engaged into the internal threads of the holes 124.

Figure 4:
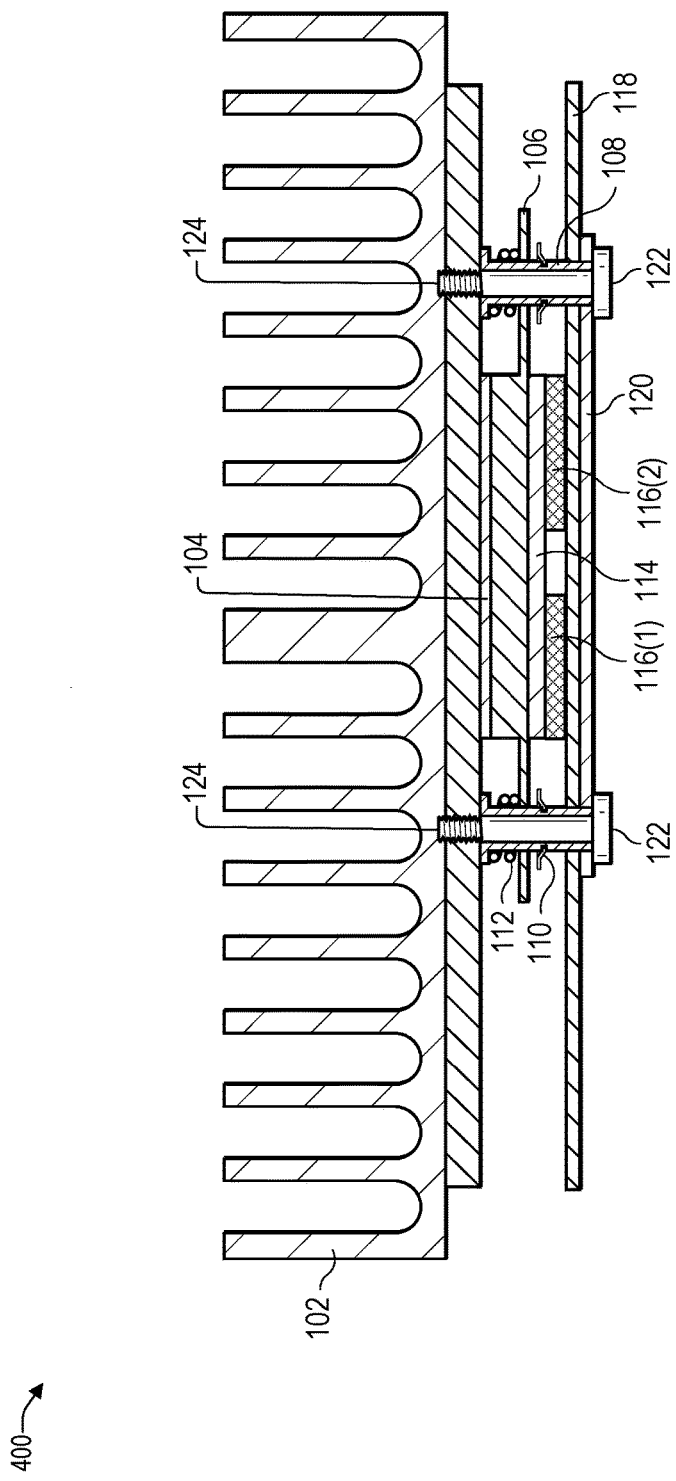
FIG. 4 is a block diagram illustrating a third position of a mechanism to mount a heatsink to a circuit board according to some embodiments.

FIG. 4 is a block diagram illustrating a third position 400 of a mechanism to mount a heatsink to a circuit board according to some embodiments. In the third position 400, each of the fasteners 122 (e.g., screws) may be fully engaged (e.g., completely screwed in) into the corresponding holes 124 in the heatsink 102, thereby securing the external threads of the fasteners 122 into the internal threads of the holes 124. The standoffs 108 may be attached to the heatsink 102 and to the thermal spreader 106. The locking rings 110 may secure the standoffs 108 to the thermal spreader 106. A top surface of the first thermal pad 104 may be in contact with a bottom surface of the heatsink 102. A bottom surface of the first thermal pad 104 may be in contact with a top surface of the thermal spreader 106. A bottom surface of the second thermal pad 114 may be in contact with a top surface of heat generating components 116(1), 116(2) that are mounted on the circuit board 118. The springs 112 may be fully compressed (e.g., as compared to FIGS. 2 and 3) due to the external threads of the fasteners (e.g., screws) 122 being fully engaged (e.g., completely screwed in) into the internal threads of the holes 124.

In FIG. 4, the heatsink 102 is rigidly mounted to the circuit board 118 by engaging the external threads of the fasteners 122 into the internal threads of the holes 124 and screwing the fasteners 122 into the holes 124. In addition, because of the springs 112, the thermal spreader 106 "floats" relative to the heat generating components 116, thereby enabling the thermal spreader 106 to maintain a relatively uniform amount of pressure on the components 116. The thermal spreader 106 may maintain a relatively uniform amount of pressure on the components 116 even when there are (1) variations in the lengths of individual standoffs 108, (2) warping of the circuit board 118, (3) differences in the height of the top most surface of individual components 116, or any combination thereof.

A relatively uniform amount of pressure may mean that a first amount of pressure exerted on component 116(1) is within a predetermined amount of a second amount of pressure exerted on component 116(2). A relatively uniform amount of pressure may mean that a first amount of pressure exerted on a portion of a particular component (e.g., the component 116(1)) is within a predetermined amount of a second amount of pressure exerted on a different portion of the same particular component. For example, the amount of pressure exerted on each of the four corners and on the center of the top surface of a particular one of the components 116 may not vary by more than a predetermined amount. Because the springs 112 can compress and expand, the amount of compression in at least two of the springs 112 may vary and the amount of pressure exerted by at least two of the springs 112 may vary, thereby compensating for differences in standoff 108 length, differences in the heights of the components 116, and warping of the circuit board 118.

While the fasteners 122 in FIGS. 1, 2, 3, and 4 are illustrated as being machine screws that engage in the inner threads of the holes 124, other types of fasteners, such as, for example, anchors, bolts, hardware, nails, nuts, pins, clips, rivets, rods, and the like may be used to mount the heatsink 102 to the circuit board 118.

Figure 5:
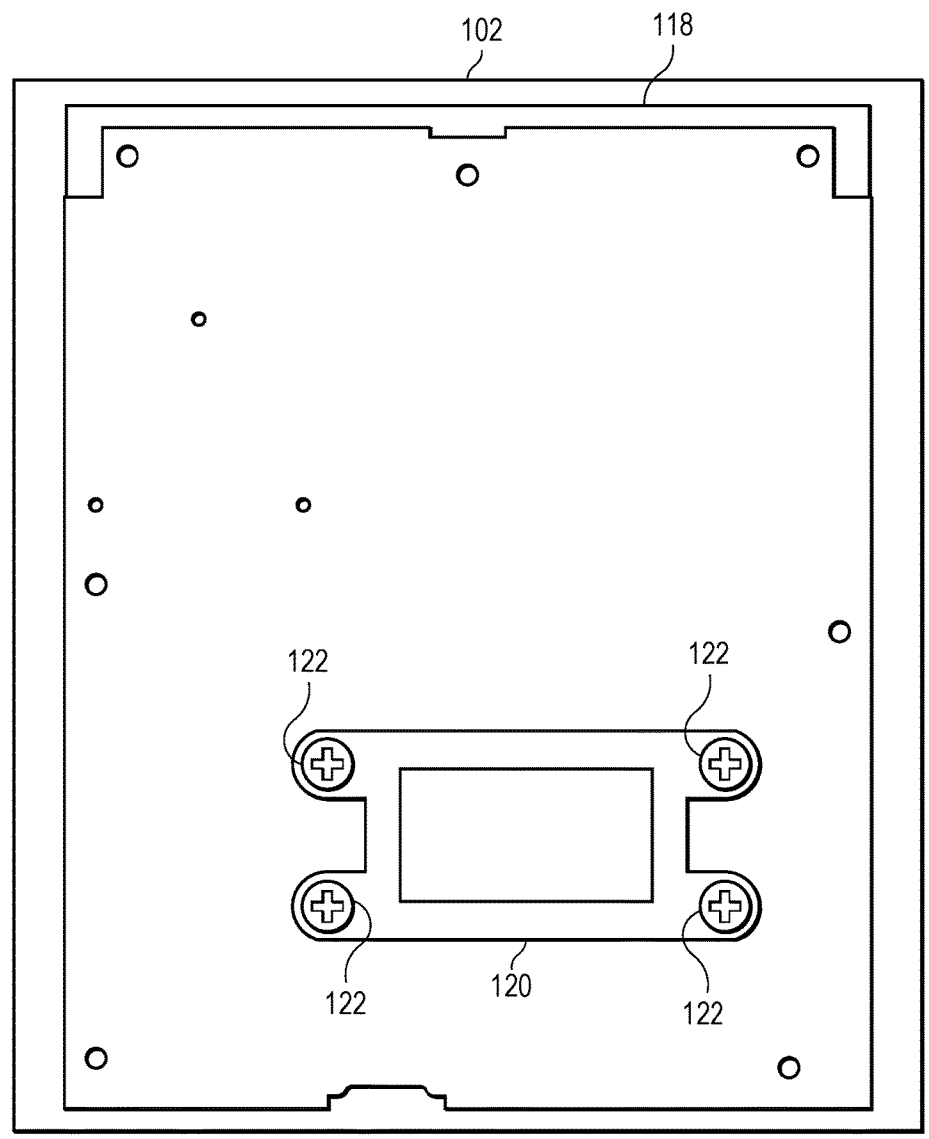
FIG. 5 is a block diagram illustrating a bottom perspective of a mechanism to mount a heatsink to a circuit board according to some embodiments.

FIG. 5 is a block diagram 500 illustrating a bottom perspective of a mechanism to mount a heatsink to a circuit board according to some embodiments. For example, FIG. 5 illustrates how the mechanism 100 of FIG. 1 may appear when viewed from the bottom.

The heatsink 102 may be attached to the circuit board 118 using multiple fasteners 122. The fasteners 122 may pass through the backplate 120 and the circuit board 118, to attach to the heatsink 102. For example, the fasteners 122 may be screws that have external threads that engage in internal threads of holes in the heatsink 102. The backplate 120 may be used to prevent the fasteners 122 from exerting too much pressure or otherwise damaging the circuit board 118. For example, the backplate 120 may distribute the pressure exerted by the fasteners 122 on the circuit board 118. The backplate 120 may be a single piece of a material that is non-conductive. In some cases, the backplate may include a rectangular-shaped cutout in the center, as illustrated in FIG. 5.

Figure 6:
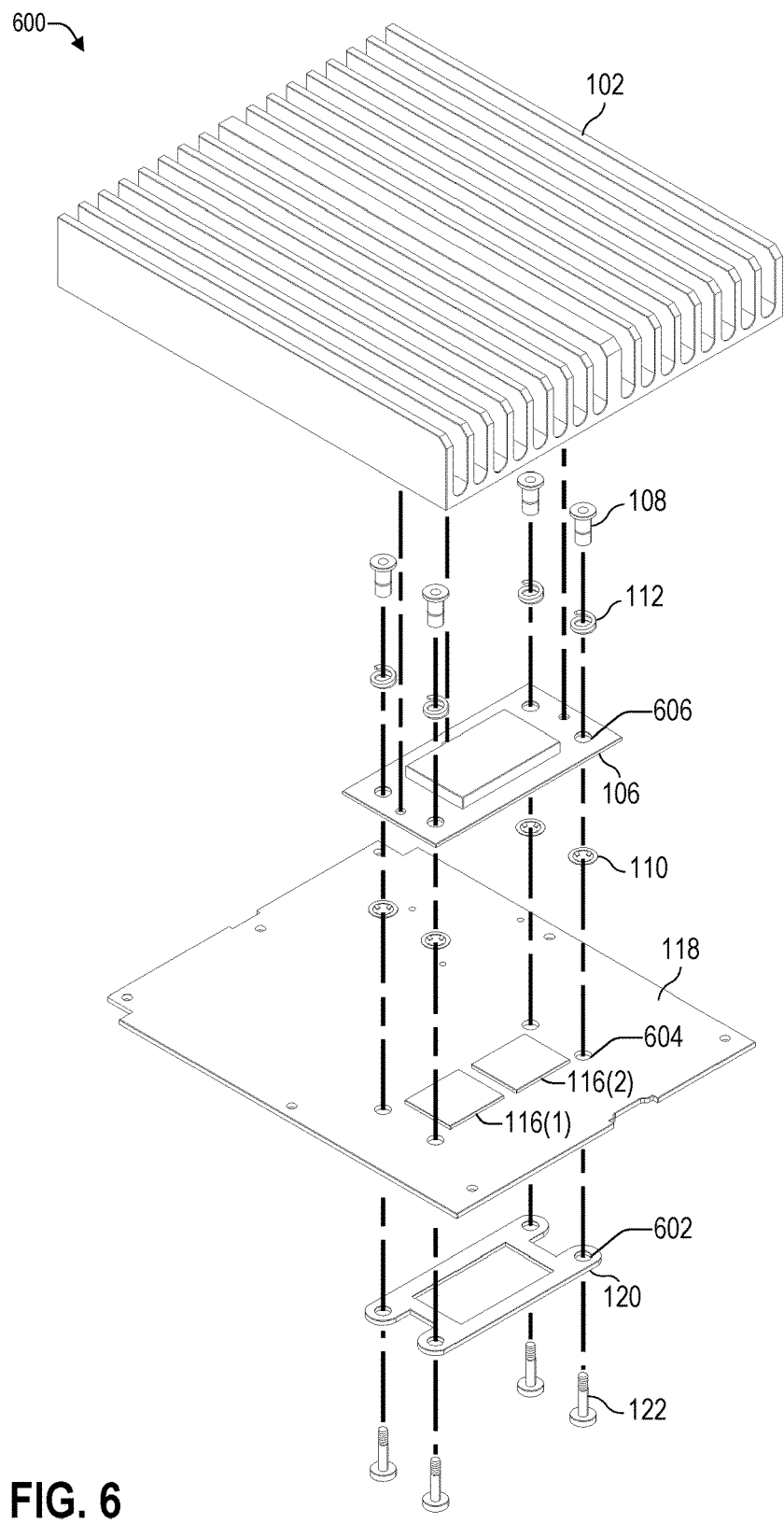
FIG. 6 is a block diagram illustrating a three-dimensional perspective of components of a mechanism to mount a heatsink to a circuit board according to some embodiments.

FIG. 6 is a block diagram 600 illustrating a three-dimensional perspective of components of a mechanism (e.g., the mechanism 100 of FIG. 1) to mount a heatsink to a circuit board according to some embodiments. For ease of understanding, the first thermal pad 104 and the second thermal pad 114 of FIG. 1 are not shown in FIG. 6. However, it should be understood that one or both of the first thermal pad 104 and the second thermal pad 114 may be used.

While the standoffs 108 are shown as being separate from the heatsink 102, in some cases, the standoffs 108 may be attached (e.g., screwed, welded, epoxied, or the like) to the heatsink 102, and in other cases, the standoffs 108 may be a part of the heatsink 102 (e.g., the standoffs 108 may be machined or diecast as part of the heatsink 102). In cases where the standoffs 108 are separate from the heatsink 102, attaching the fasteners 122 to the heatsink 102 (e.g., via the holes 124 of FIG. 1) may cause the standoffs 108 to remain in place. The springs 112 may slip over an external surface of each of the standoffs 108. The standoffs 108 may be secured to the thermal spreader 106 using the locking rings 110.

The fasteners 122 may be used to attach the circuit board 118 to the thermal spreader 106 and to the heatsink 102. For example, each of the fasteners 122 may pass through (1) a corresponding hole 602 in the backplate 120, (2) a corresponding hole 604 in the circuit board 118, and (3) a corresponding standoff 108. Each of the standoffs 108 may pass through (1) a corresponding spring 112, (2) a corresponding hole 606 in the thermal spreader 106, and (3) a corresponding locking ring 110.

If the standoffs 108 are not attached to the heatsink 102, then the fasteners 122 may pass through the standoffs 108 and attach to the heatsink 102. For example, external threads of the fasteners 122 may engage internal threads of holes (e.g., the holes 124 of FIG. 1) in the heatsink 102 to fasten the heatsink 102 and the thermal spreader 106 to the circuit board 118.

If the standoffs 108 are attached to the heatsink 102, then the fasteners 122 may be attached to the standoffs 108. For example, external threads of the fasteners 122 may engage internal threads of holes in the standoffs 108 to fasten the heatsink 102 and the thermal spreader 106 to the circuit board 118.

The springs 112 may enable the thermal spreader 106 to apply a relatively uniform amount of pressure to each of the top surfaces of the components 116. While two heat generating components 116(1), 116(2) are illustrated, it should be understood that the circuit board 118 may include one or more heat generating components, such as, for example, CPU, chip set associated with the CPU, GPU, memory (e.g., RAM), SSD, voltage regulator, and the like.

In some cases, the heatsink 102 along with the first thermal pad 104 of FIG. 1 may be mounted to the circuit board 118 in such a way that the first thermal pad 104 is in contact with the heat generating components 116. In such cases, the thermal spreader 106 and the second thermal pad 114 may be omitted.

Figure 7:
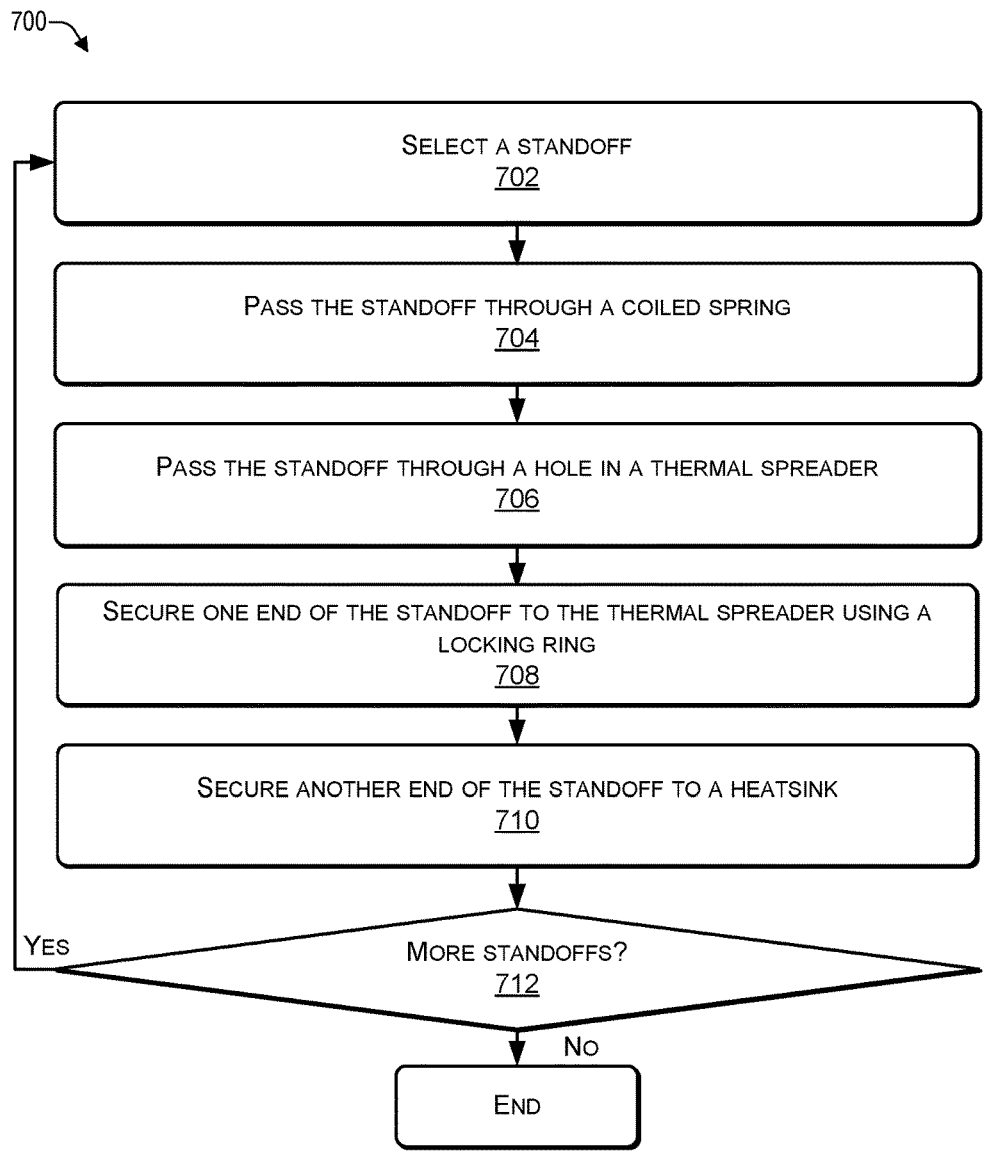
FIG. 7 is a flow diagram illustrating a process to secure a standoff according to some embodiments.
Figure 8:
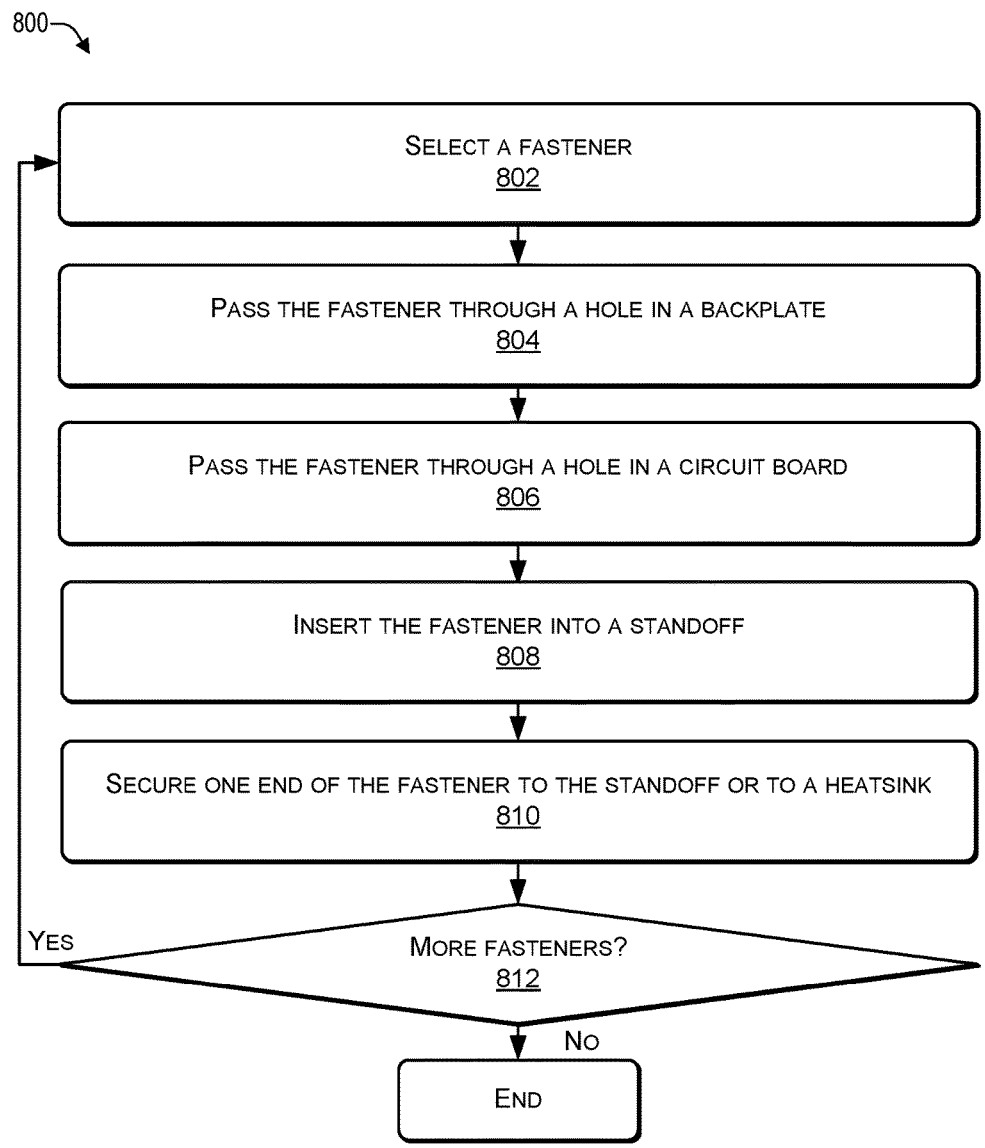
FIG. 8 is a flow diagram illustrating a process to secure a fastener according to some embodiments.

In the flow diagrams of FIG. 7 and FIG. 8, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the processes 700 and 800 are described with reference to FIGS. 1, 2, 3, 4, 5, and 6, as described above, although other models, frameworks, systems and environments may be used to implement this process.

FIG. 7 is a flow diagram illustrating a process 700 to secure a standoff according to some embodiments. The process 700 may be performed by an automated (e.g., robotic) manufacturing facility.

At 702, a standoff may be selected. At 704, the standoff may pass through a coiled spring. At 706, the standoff may pass through a hole drilled in a thermal spreader. At 708, one end of the standoff may be secured to the thermal spreader using a locking ring (or a nut). For example, in FIG. 6, the standoff 108 may passthrough the coiled spring 112, and through the hole 606 in the thermal spreader 106. The standoff 108 may be secured to the thermal spreader 106 using the locking ring 110, a nut, or a similar mechanism.

At 710, another end of the standoff may be secured to a heatsink. For example, in some cases, the standoff 108 may be secured to the heatsink 102 using glue, spot welding, by mating outer threads of the standoff 108 with inner threads of holes in the heatsink 102, or another type of mechanism.

At 712, a determination may be made whether there are additional standoffs. If a determination is made at 712, that "yes" there are additional standoffs, then the process may proceed to 702 where another standoff may be selected. For example, in FIG. 6, the process 700 may be repeated until all four of the standoffs 108 have been selected. If a determination is made at 712, that "no" there are no additional standoffs, then the process may end.

FIG. 8 is a flow diagram illustrating a process 800 to secure a fastener according to some embodiments. The process 800 may be performed by an automated (e.g., robotic) manufacturing facility.

At 802, a fastener may be selected. At 804, the fastener may pass through a hole in a backplate. At 806, the fastener may pass through a hole in a circuit board. At 808, the fastener may be inserted into a standoff. At 810, one end of the fastener may be secured to the standoff or to a heatsink. For example, in FIG. 6, the fastener 122 may pass through the hole 602 in the backplate 120 and the hole 604 in the circuit board 118. The fastener 122 may be inserted into the standoff 108.

If the standoff 108 is a part of the heatsink 102 or if the standoff 108 has been secured to the heatsink 102, then the fastener 122 may be fastened to the standoff 108. For example, external threads of the fastener 122 may engage with internal threads in the standoff 108 to fasten the fastener 122 to the standoff 108.

If the standoff 108 is not a part of the heatsink 102 and the standoff 108 has not been secured to the heatsink 102, then the fastener 122 may be fastened to the heatsink 102. For example, external threads of the fastener 122 may engage with internal threads in the holes 124 of FIG. 1 to fasten the fastener 122 to the heatsink 102.

At 812, a determination may be made whether there are additional fasteners. If a determination is made at 812, that "yes" there are additional fasteners, then the process may proceed to 802 where another fastener may be selected. For example, in FIG. 6, the process 800 may be repeated until all four of the fasteners 122 have been selected. If a determination is made at 812, that "no" there are no additional fasteners, then the process may end.

Figure 9:
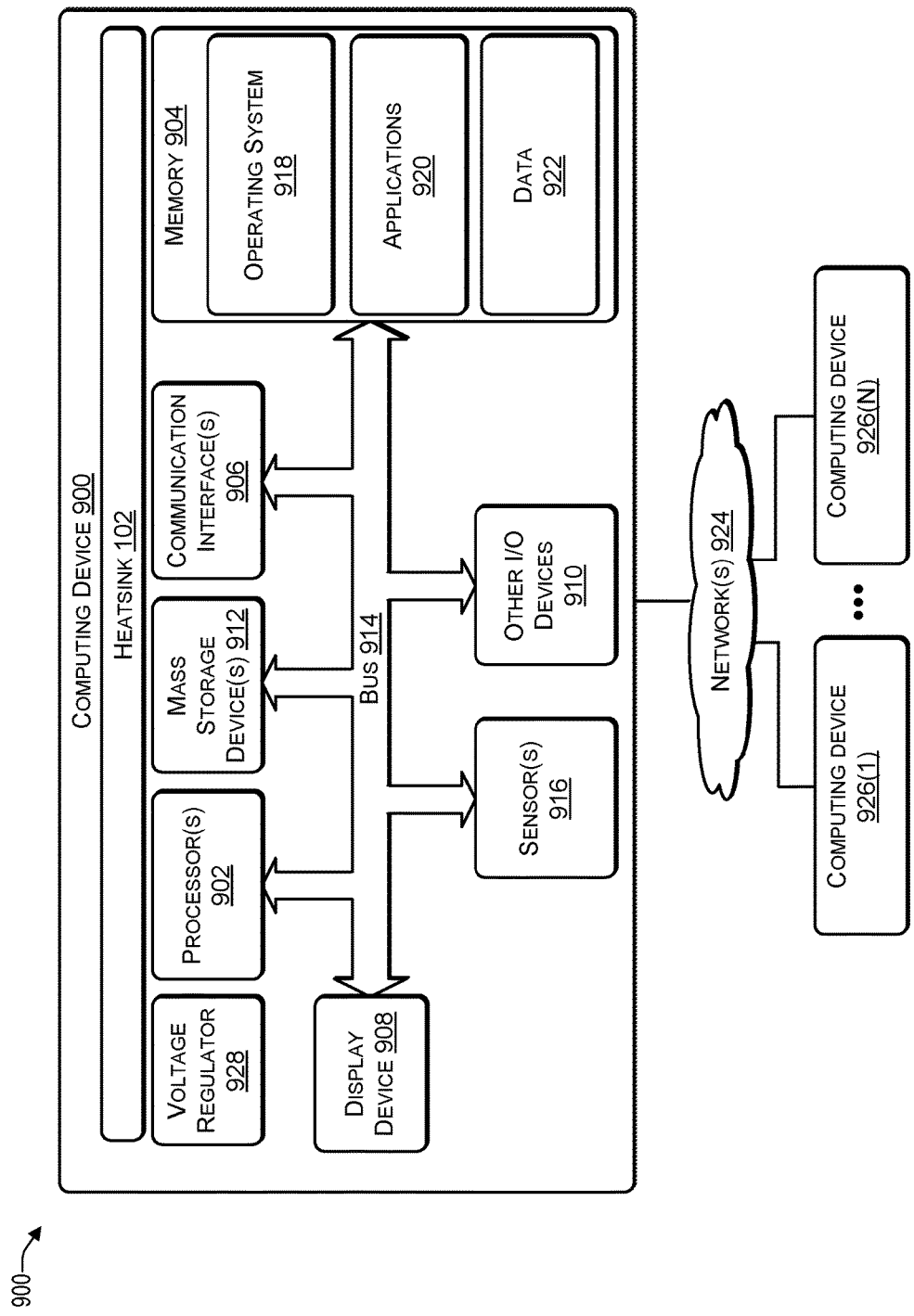
FIG. 9 illustrates an example configuration of a computing device that can be used to implement the systems and techniques described herein.

FIG. 9 illustrates an example configuration of a computing device 900 that can be used to implement the systems and techniques described herein. For example, the computing device 900 may be an edge gateway or other type of computing device. The computing device 900 may include one or more processors 902 (e.g., CPU, GPU, or the like), a memory 904, communication interfaces 906, a display device 908, other input/output (I/O) devices 910 (e.g., keyboard, trackball, and the like), one or more sensors 916, and one or more mass storage devices 912 (e.g., disk drive, solid state disk drive, or the like), configured to communicate with each other, such as via one or more system buses 914 or other suitable connections. While a single system bus 914 is illustrated for ease of understanding, it should be understood that the system buses 914 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 902 are one or more hardware devices that may include a single processing unit or a number of processing units, all of which may include single or multiple computing units or multiple cores. The processors 902 may include a graphics processing unit (GPU) that is integrated into the CPU or the GPU may be a separate processor device from the CPU. The processors 902 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 902 may be configured to fetch and execute computer-readable instructions stored in the memory 904, mass storage devices 912, or other computer-readable media.

Memory 904 and mass storage devices 912 are examples of computer storage media (e.g., memory storage devices) for storing instructions that can be executed by the processors 902 to perform the various functions described herein. For example, memory 904 may include both volatile memory and non-volatile memory (e.g., RAM, ROM, or the like) devices. Further, mass storage devices 912 may include hard disk drives, solid-state drives, removable media, including external and removable drives, memory cards, flash memory, floppy disks, optical disks (e.g., CD, DVD), a storage array, a network attached storage, a storage area network, or the like. Both memory 904 and mass storage devices 912 may be collectively referred to as memory or computer storage media herein, and may be any type of non-transitory media capable of storing computer-readable, processor-executable program instructions as computer program code that can be executed by the processors 902 as a particular machine configured for carrying out the operations and functions described in the implementations herein.

The computing device 900 may include one or more communication interfaces 906 for exchanging data with other computing devices 926 via a network 924. The communication interfaces 906 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 906 can also provide communication with external storage, such as a storage array, network attached storage, storage area network, cloud storage, or the like.

The display device 908 may be used for displaying content (e.g., information and images) to users. Other I/O devices 910 may be devices that receive various inputs from a user and provide various outputs to the user, and may include a keyboard, a touchpad, a mouse, a printer, audio input/output devices, and so forth.

The computer storage media, such as memory 904 and mass storage devices 912, may be used to store software and data. For example, the computer storage media may be used to store an operating system 918, one or more applications 920, and data 922.

The heatsink 102 may be used to dissipate heat from one or more heat generating components of the computing device 900, such as, for example, the processors 902, the memory 904, the mass storage devices 912, a voltage regulator 928, a chip set associated with the processors 902, another heat generating component of the computing device 900, or any combination thereof. The components of the computing device 900 may be mounted on a circuit board, such as the circuit board 118 of FIG. 1. The heatsink 102 may be mounted to the circuit board using fasteners inserted through standoffs. Coiled springs may slip over each standoff and enable the heatsink 102 to apply a relatively uniform amount of pressure on the heat generating components of the computing device 900, thereby compensating for differences in the length (e.g., height) of each standoff, differences in the height of the external surface of each heat generating component, warping of the circuit board, and the like. In this way, the heatsink 102 may be rigidly mounted while allowing the heatsink 102 to float and maintain a relatively uniform amount of pressure on the heat generating components. The relatively uniform amount of pressure enables heat that is generated to be dissipated by the heatsink 102 without exerting an amount of pressure that exceeds the packaging specifications of the components, thereby preventing the packaging of the components from cracking.

Figure 10:
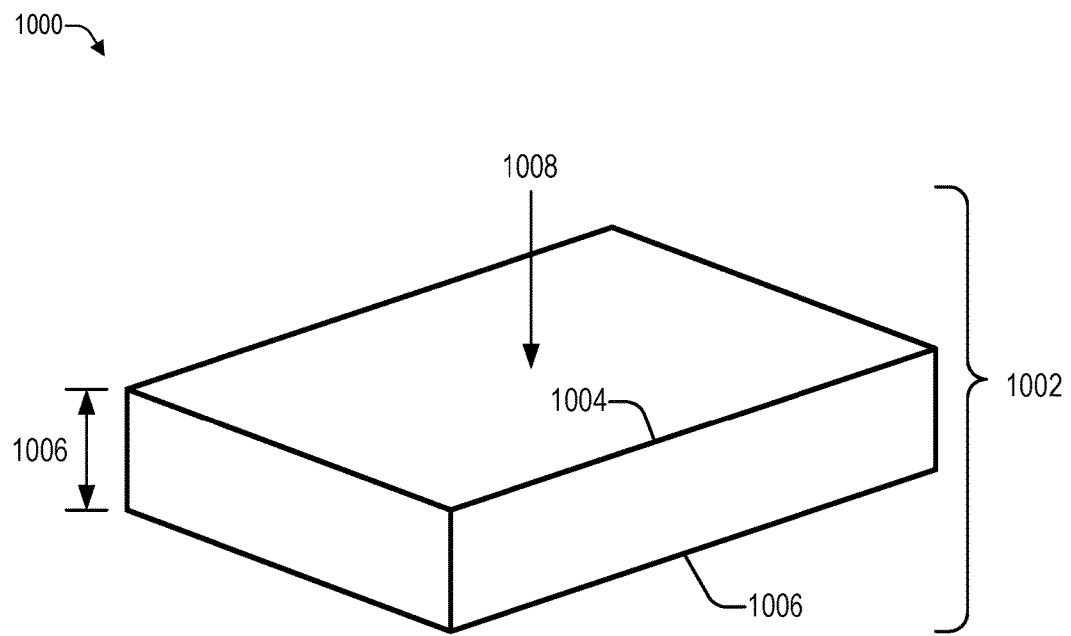
FIG. 10 is a block diagram illustrating thermal dissipation according to some embodiments.
Figure 10:
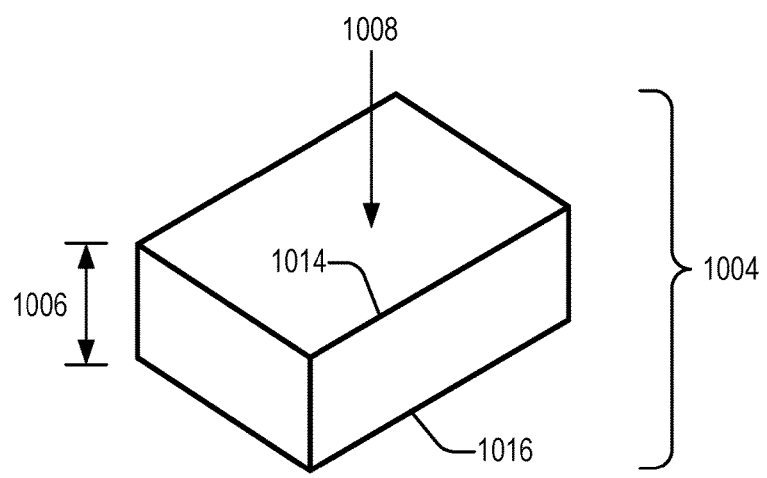

FIG. 10 is a block diagram 1000 illustrating thermal dissipation according to some embodiments. In FIG. 10, a temperature difference ΔT between a top (e.g., dissipation) surface and a bottom (e.g., in contact with heat generating components) surface can be expressed as:

$$\Delta T = T_{HOT} + T_{COLD} = P \times R_{TH}$$

where $$R_{TH} = L/(K_{TH} \times A)$$

and $K_{TH}$=thermal conductivity in Watts per meter-Kelvin (W/m-K)

For example, in FIG. 10, assume block 1002 has an area of 1,000 mm² and block 1004 has an area of 100 mm². Assume also that both blocks 1002, 1004 have a height 1006 of 1 mm, $K_{TH}$ is W/m-K, and the amount of power 1008 being dissipated is 15 watts (W). In FIG. 10, $T_{HOT1}$ 1004, $T_{COLD1}$ 1006, $T_{HOT2}$ 1014, and $T_{COLD2}$ 1016. Then:

$$\Delta T_1 = T_{HOT1} - T_{COLD1} = 15 \times 10^{-3}/(1000 \times 10^{-6})/3 = 5 \text{Celsius}(C)$$

and $$\Delta T_2 = T_{HOT2} - T_{COLD2} = 15 \times 10^{-3}/(100 \times 10^{-6})/3 = 50C$$

FIG. 10 illustrates how, given the same thickness 1006 of a thermal pad, a thermal spreader, or a heatsink, increasing the size (e.g., from 100 mm² to 1,000 mm²) of the thermal pad, the thermal spreader or the heatsink can significantly increase thermal dissipation, resulting in lower temperatures of the components. The temperature difference (ΔT)

between the top surface and the bottom surface may be reduced from 50 C (in the case of block 1004) to 5 C (in the case of block 1002).

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A computing device comprising: a heatsink; a thermal spreader that includes a plurality of mounting holes; a first thermal pad located between the heatsink and the thermal spreader; a circuit board comprising a plurality of components; a second thermal pad located between the thermal spreader and the circuit board; a plurality of standoffs located between the heatsink and the circuit board; a plurality of springs, wherein each standoff of the plurality of standoffs: passes through a corresponding spring of the plurality of springs; and passes through a corresponding mounting hole of the plurality of mounting holes in the thermal spreader; and a plurality of screws, wherein each screw of the plurality of screws engages with a corresponding standoff of the plurality of standoffs; wherein the plurality of springs cause the thermal spreader and the second thermal pad to apply a predetermined amount of pressure to each of the plurality of components.

2. The computing device of claim 1, wherein the second thermal pad is in contact with an upper surface of individual components of the plurality of components.

3. The computing device of claim 1, wherein the predetermined amount of pressure is less than a maximum amount of pressure that individual components of the plurality of components are designed to withstand.

4. The computing device of claim 1, wherein the plurality of components comprise a central processing unit (CPU) and at least one of:
   a graphics processing unit (GPU);
   a CPU chip set;
   a voltage regulator;
   a wireless communication card;
   a hard disk drive;
   a solid disk drive (SSD); or
   random access memory (RAM).

5. The computing device of claim 1, wherein the second thermal pad comprises:
   a silicone or polysynthetic oil base; and
   at least one of ceramic particles, silver particles, zinc oxide particles, aluminum oxide particles, boron nitride particles, or aluminum particles.

6. The computing device of claim 1, wherein:
   a corresponding locking ring is used to secure each standoff of the plurality of standoffs to the thermal spreader.

7. The computing device of claim 1, wherein:
   the standoffs are integrated into the heatsink; or
   the standoffs are fastened to the heatsink.

8. A computing device comprising: a circuit board; a plurality of heat-generating components mounted on the circuit board; a thermal spreader having a first thermal pad above the thermal spreader and a second thermal pad below the thermal spreader; a plurality of standoffs; a heatsink placed on top of the plurality of standoffs, wherein: the heatsink is attached to the circuit board using a plurality of screws that engage with the standoffs; and the first thermal pad is located below the heatsink; and a plurality of springs, wherein individual standoffs of the plurality of standoffs pass through individual springs of the plurality of springs, wherein the springs cause the second thermal pad to apply an amount of pressure that is within a predetermined range to each of the heat-generating components.

9. The computing device of claim 8, wherein the plurality of heat-generating components comprise a central processing unit (CPU) and at least one of:
   a graphics processing unit (GPU);
   a CPU chip set;
   a voltage regulator;
   a wireless communication card;
   a hard disk drive;
   a solid disk drive (SSD); or
   random access memory (RAM).

10. The computing device of claim 8, wherein:
    a top surface of the first thermal pad is in contact with a bottom surface of the heatsink; and
    a bottom surface of the first thermal pad is in contact with a top surface of the thermal spreader.

11. The computing device of claim 8, wherein:
    a top surface of the second thermal pad is in contact with a bottom surface of the thermal spreader; and
    a bottom surface of the second thermal pad is in contact with a top surface of the heat-generating components.

12. The computing device of claim 8, wherein:
    the thermal spreader comprises a copper alloy.

13. The computing device of claim 8, wherein the second thermal pad comprises at least one of:
a thermal grease, a thermal gel, a thermal pad, or an epoxy.

14. A computing device comprising: a heatsink; a thermal spreader comprised of copper that includes a plurality of mounting holes; a first thermal pad located between the heatsink and the thermal spreader; a circuit board comprising a plurality of heat-generating components; a second thermal pad located between the thermal spreader and the circuit board; a plurality of standoffs located between the heatsink and the circuit board; a plurality of springs, wherein each standoff of the plurality of standoffs: passes through a corresponding spring of the plurality of springs; and passes through a corresponding mounting hole of the plurality of mounting holes in the thermal spreader; and a plurality of screws, wherein each screw of the plurality of screws engages with a corresponding standoff of the plurality of standoffs; wherein the plurality of springs cause the thermal spreader and the second thermal pad to apply an amount of pressure to each of the plurality of heat-generating components that is within a predetermined range.

15. The computing device of claim 14, wherein:
the heatsink is part of an enclosure for the computing device.

16. The computing device of claim 14, further comprising:
a backplate having a plurality of holes, wherein each screw of the plurality of screws passes through a corresponding hole of the plurality of holes.

17. The computing device of claim 14, wherein:
the amount of pressure applied to the plurality of heat-generating components is sufficient to enable the second thermal pad to make contact with a predetermined percentage of an external surface of individual heat-generating components of the plurality of heat-generating components.

18. The computing device of claim 14, wherein the plurality of heat-generating components comprise a central processing unit (CPU).

19. The computing device of claim 18, wherein the plurality of heat-generating components further comprise at least one of:
a graphics processing unit (GPU);
a CPU chip set;
a voltage regulator;
a wireless communication card;
a hard disk drive;
a solid disk drive (SSD); or
random access memory (RAM).

20. The computing device of claim 14, wherein the second thermal pad comprises:
a silicone or polysynthetic oil base; and
at least one of ceramic particles, silver particles, zinc oxide particles, aluminum oxide particles, boron nitride particles, or aluminum particles.

* * * * *